United States Patent [19]

Mitchell et al.

[11] Patent Number: 5,573,679
[45] Date of Patent: Nov. 12, 1996

[54] FABRICATION OF A SURFACE MICROMACHINED CAPACITIVE MICROPHONE USING A DRY-ETCH PROCESS

[75] Inventors: Alan W. Mitchell, Rio Rancho, N.M.; Yuebin B. Ning; R. Niall Tait, both of Edmonton, Canada

[73] Assignees: Alberta Microelectronic Centre, Edmonton; Harris Canada Inc., Calgary, both of Canada

[21] Appl. No.: 492,320

[22] Filed: Jun. 19, 1995

[51] Int. Cl.⁶ .................................................. B44C 1/22
[52] U.S. Cl. .................................. 216/2; 216/56; 216/69; 156/643.1; 156/644.1
[58] Field of Search ................................. 216/2, 33, 41, 216/56, 66, 69; 156/643.1, 644.1, 657.1, 659.1, 662.1; 437/927

[56] References Cited

U.S. PATENT DOCUMENTS 4,558,184  12/1985  Busch-Vishniac et al. .
5,316,619   5/1994  Mastrangelo ................... 156/644.1

FOREIGN PATENT DOCUMENTS 1210131  8/1986  Canada .
2092627  3/1993  Canada .

OTHER PUBLICATIONS

Scheeper, P. R., et al., "Improvement of the performance of microphones with a silicon nitride diaphragm and backplate", Sensors and Actuators A, 40(1994), pp. 179–186.
Scheeper, P. R. et al, "Fabrication of Silicon Condenser Microphones Using Single Wafer Technology", Journal of Microelectromechanical Systems, vol. 1, No. 3, Sep. 1992.

Oehrlein, G. S. et al., "Plasma–based dry etching techniques in the silicon integrated circuit technology", IBM J. Res. Develop., vol. 36, No. 2, Mar. 1992, pp. 140–157.
Bernstein, J., "A Micromachined Condenser Hydrophone", The Charles Stark Draper Laboratory, 1992 IEEE, Cambridge, MA, pp. 161–165.
Bernstein, J., et al., "Advanced Micromachined Condenser Hydrophone", 1994 TRF, Solid–State Sensor and Actuator Workshop, Hilton Head, SC, Jun. 1994, pp. 73–77.
Bergqvist, J. et al., "Capacitive Microphone with a Surface Micromachined Backplate Using Electroplating Technology", Journal of Microelectromechanical Systems, vol. 3, Jun. 1994.
van der Donk, A. G. H., "A Silicon Condenser Microphone", Jan. 1962, pp. 117–124.
Hijab, R. S. et al., "Micromechanical Thin–Film Cavity Structures for Low Pressure . . .", 1985 IEEE, University of California, Berkeley, CA, pp. 178–181.
Walsh, S. T., et al., "Overcoming stiction in MEMS manufacturing", Micro, Mar. 1995, pp. 49–58.

Primary Examiner—William Powell
Attorney, Agent, or Firm—Cesari and McKenna

[57] ABSTRACT

Capacitive microphones are fabricated using etch-release of sacrificial silicon by an isotropic dry etchant. The process allows the production of a microphone largely from CVD processes with flexibility in materials selection. The dry etch chemistry does not require freeze-drying after release. The etchant does not attack electrodes or metallized circuitry and so allows the placement of the electrodes between the backplate and diaphragm dielectric layers. Diffusion barrier layers between the sacrificial and electrode layers protect both materials from interdiffusion during device fabrication. The process is especially fitting for a microphone comprising silicon nitride dielectric layers with aluminum electrodes.

34 Claims, 6 Drawing Sheets

FABRICATION OF A SURFACE MICROMACHINED CAPACITIVE MICROPHONE USING A DRY-ETCH PROCESS

FIELD OF THE INVENTION

This invention relates to acoustoelectric transducers. Particularly, this invention relates to fabrication Techniques for capacitive microphones which may be integrated into a semiconductor substrate.

BACKGROUND OF THE INVENTION

A capacitive microphone typically comprises a diaphragm, consisting of an electrode attached to a flexible support member, separated by an airgap from a parallel backplate consisting of an electrode attached to a rigid support member. The backplate has one or more acoustic holes that allow air to flow into and out of the airgap. Acoustic pressure incident on the diaphragm causes it to deflect, thereby changing the capacitance of the parallel-plate structure. The change in capacitance is processed by other electronics to provide a corresponding electrical signal.

Although metals have the appropriate electrical properties for the diaphragm and backplate, their chemical fragility makes them vulnerable to the aggressive thermal and chemical environment of device manufacture and also to corrosive attack during the lifetime of the device. For these reasons layers of a more chemically robust dielectric material with desired mechanical properties are typically used as support members FOR the electrodes. Good mechanical sensitivity for operation at low bias voltages is promoted by a thin, large-area, low-stress diaphragm.

When such layered diaphragms and backplates are used, the most desirable arrangement for good electrical sensitivity is to locate the electrodes opposite one another on the airgap sides, rather than on the exterior sides, of the dielectric layers, because dielectric material between the electrodes adds a fixed component in series with the variable airgap capacitance. With the electrodes on the outer surfaces of dielectric layers that are thick enough to provide a series capacitance comparable to the airgap capacitance, the device sensitivity can be decreased due to reduced electric field in the airgap and reduced device capacitance. Also, the location of the electrodes inside the airgap affords them protection from chemical attack during fabrication and use of the device.

Various methods and materials have been used for fabricating these microphones. Organic films have been used for the diaphragm. These are positioned manually on a stamped metal piece or a silicon wafer containing a backplate and then fixed in place by a polymer spray. An alternative approach is to mount the diaphragm on a separate support wafer that is then joined to a backplate water. The use of such films, however, is less than ideal because temperature and humidity effects on the film result in drift in long-term microphone performance.

This problem has been addressed by making solid state microphones using semiconductor techniques. The well-established technology of bulk silicon micromachining, in which a silicon substrate is patterned by etching to from electromechanical structures, has been applied to manufacture of these devices. Typically, the diaphragm and backplate are fashioned on separate silicon wafers which are then bonded together. Silicon nitride is commonly used for the dielectric layers because it has low chemical activity and its film stress can be tailored by adjusting process parameters of the film deposition. After bonding, the pair of waters is diced into individual devices. Alternatively, the two components can be joined after the wafers have been diced into individual device components. In either case, these techniques require some sort of assembly procedure to obtain a complete microphone. This assembly requirement imposes a practical limit on sensor miniaturization. The critical alignment steps are labor-intensive with low yield and give rise to lack of consistency in performance across devices. Also, the bonding processes generally involve high temperatures and may adversely alter the properties of the microphone constituents or integrated circuitry.

To obviate these difficulties, the production of microphones by a single-wafer process using surface micromachining, in which layers deposited onto a silicon substrate are patterned by etching, has been proposed. (See, e.g., Hijab and Muller, "Micromechanical Thin-Film Cavity Structures for Low-Pressure and Acoustic Transducer Applications," in Digest of Technical Papers, Transducers '85, Philadelphia, Pa., pp. 178–81 [1985].) Microphone manufacture according to this process is based on the sacrificial layer etch-release technique. Successive layers are deposited onto a silicon substrate to from a structure including a layer of sacrificial material placed between a backplate and diaphragm. Access holes in the backplate allow introduction of an etchant which makes a cavity in, or releases, the sacrificial material, thereby forming the airgap between the electrodes. The remaining sacrificial material around the cavity fixes the quiescent distance between the diaphragm and backplate. The access holes then act as acoustic holes during the normal operation of the microphone. This approach is compatible with conventional semiconductor processing techniques and is more amenable to monolithic integration of sensor and electronics than are techniques requiring mechanical assembly.

Several issues must be considered in the selection of etchant and sacrificial material for this process. The etchant should act isotropically to underetch the backplate and completely remove sacrificial material to form the cavity without detriment to the diaphragm or backplate. In the case of a composite diaphragm or backplate, the inactivity of the etchant with respect to the material abutting the sacrificial layer is especially important. The ideal sacrificial material would be robust to high-temperature semiconductor processing methods and also depositable without damage to existing layers. Both the deposition and etching of the sacrificial material should be easy to incorporate into conventional semiconductor processing lines. A system with this combination of attributes has not been available.

Examples from the prior art illustrate the difficulties in achieving this ideal. One demonstrated technique is the use of sacrificial aluminum and wet acidic etchant with diaphragm and backplate of silicon nitride support members with aluminum electrodes. (See, e.g., Scheeper et al., *Journal of Microelectromechanical Systems*, 1, 147–54 [1992].) A typical etchant composition includes a mixture of aqueous acids such as nitric, acetic and phosphoric. Such wet etchants are isotropic with high selectivity between aluminum and silicon nitride. However, capillary forces exerted by the etchant residue cause the diaphragm and backplate to stick together, so the etch must be followed by an elaborate freeze-drying procedure to adequately remove the residue. The freeze-drying is time-consuming and requires a high-vacuum apparatus. Also, because the sacrificial and electrode materials are the same, the electrodes are vulnerable to attack by the etchant and must be nonoptimally located on the sides of the dielectric support layers away from the airgap. Furthermore, the metal lines of the chip circuitry themselves are subject to attack by the acids.

The use of sacrificial silicon and aqueous tetramethylammonium hydroxide etchant with diaphragm and backplate having silicon nitride support members with aluminum electrodes has been proposed, although not demonstrated, by van der Donk (*A Silicon Condenser Microphone: Modeling and Electronic Circuitry*, doctoral dissertation, Universiteit Twente, [1992]). The description specifies that etching be followed by an aqueous methanol rinse and freeze-drying. Although the sacrificial layer and electrodes are of different materials in this case, the etchant is not sufficiently selective between aluminum and silicon to provide any protection to the electrodes or circuitry.

Use of sacrificial photoresist and either a wet etchant or a dry oxygen-plasma etchant with a electroplated monolithic copper backplate was reported by Bergqvist et al. (*Journal of Microelectromechanical Systems*, 3, 69 [1992]). Isotropic removal of photoresist by an oxygen-plasma is a well established technique. The dry etchant's selectivity of photoresist over the electrode metal is sufficient to allow location of the backplate electrode inside the air gap; however, the temperature limitations of the photoresist material would not allow its use in conjunction with any higher temperature process-such as chemical vapor deposition ("CCVD")—after the deposit of the sacrificial material. This proscription severely limits process design. Furthermore, although the dry-etch option obviated the need for freeze-drying, in this case it left the backplate severely buckled; this problem was only solved by an adaptation of the wet-etch process.

Accordingly, it is apparent that the prior art has not given rise to an etchant/sacrificial material combination that takes full advantage of the potential of the sacrificial etch approach to microphone fabrication.

DESCRIPTION OF THE INVENTION

Objects of the Invention

The present invention is an improved method of microphone fabrication, the advantages of which are illustrated by the following objects.

An object of the invention is the fabrication of a capacitive microphone by a sacrificial etch-release technique that is not harmful to metallized circuitry.

Another object of the invention is the fabrication of a capacitive microphone from CVD materials without freeze-drying.

Another object of the invention is the fabrication of a capacitive microphone with electrodes lining the airgap.

Still another object of the invention is the fabrication of a capacitive microphone by a process that allows flexibility in the choice of materials.

Brief Summary of the Invention

The present invention overcomes the disadvantages of prior art capacitive microphone fabrication processes by application of a dry etchant chemistry to remove sacrificial silicon and thereby form a cavity between the diaphragm and backplate. A layer of amorphous or polycrystalline silicon can be deposited using conventional semiconductor techniques such as CVD. This sacrificial layer is robust to exposure to high-temperature processing steps. This robustness allows the application of high-temperature processes to subsequent depositions, such as of the backplate, and thus allows flexibility in backplate materials selection.

Isotropic removal of the silicon is achieved by per/brining the etch release under high-pressure conditions, rather than using the reactive ion etching ("RIE") approach typically used for etching silicon. The etching may be done using a barrel reactor, such as is routinely used for the ablation of photoresist by oxygen plasma, or with other reactor configurations. A plasma including fluorine-containing species efficiently ablates the silicon sacrificial layer without damage to metallized circuitry or electrodes and without the need for freeze-drying.

The high etch selectivity by the plasma of silicon over metals allows location of the diaphragm and backplate electrodes inside the dielectric layers. The reduced fixed capacitance that results provides improved electrical sensitivity with respect to prior art devices. This configuration also relaxes the etch selectivity criterion between the sacrificial and dielectric materials and thus increases flexibility in selection of dielectric materials.

High-temperature or long-duration fabrication steps may permit sufficient interdiffusion between the silicon and the electrode materials to degrade the device properties or impede removal of the silicon. In such cases, diffusion barrier layers such as of titanium nitride or silicon dioxide between the silicon sacrificial layer and the electrodes avert this problem and allow the use of CVD processes throughout microphone fabrication.

There are several factors that have previously discouraged the consideration of sacrificial silicon removal by dry etch chemistries for this application. First of all, the emphasis on the etchant's selectivity of the sacrificial material over the dielectric material has confined earlier use of silicon for the sacrificial layer to wet etch chemistries. The van der Donk dissertation illustrates this practice. In that work, it was necessary that CMOS circuitry be in place before microphone fabrication in order to protect the microphone structure from the thermal rigors of the high-temperature oxidation and doping process. Because both basic and acidic wet etchants attack aluminum, the approach was to physically protect aluminum circuitry and electrodes during etch of the sacrificial material and to choose the etchant based on its greater etch rate of silicon with respect to the adjacent dielectric layers. This focus has inhibited consideration of dry etchant chemistries owing to their poorer selectivity of silicon over silicon nitride, even though they might have more desirable selectivity for silicon over aluminum.

Secondly, although the application of dry etchant chemistries to silicon removal is well known, it is regarded as an anisotropic etch technique. (See, e.g., Oehrlein et al., *IBM J. Res. Develop.*, 36, 140 [1992].) Although many dry etch chemistries would show advantageous selectivity of silicon with respect to aluminum, their categorization as anisotropic would deter their use in this process requiring an isotropic etchant.

Finally, with reference to Bergqvist et al., even if they had been more successful with respect to removal of the sacrificial material by a dry etchant, its extension to CVD-oriented processes would not have been obvious. The process used in that work was specifically designed for compatibility with a metallic backplate electrodeposited at low temperatures. Indeed, the use of more temperature-resistant sacrificial materials with higher-temperature processes would introduce the very problems their process averted: namely, the electrodes adjacent to the sacrificial material would be subject to interdiffusion, which could damage the electrodes or complicate removal of the sacrificial material, during subsequent processing.

BRIEF DESCRIPTION OF THE DRAWINGS

The foregoing discussion will be understood more readily from the following detailed description of the invention, when taken in conjunction with the accompanying drawings, in which.

It will appreciated that, for purposes of illustration, these figures are not necessarily drawn to scale.

DETAILED DESCRIPTION OF THE INVENTION

Figure 1:
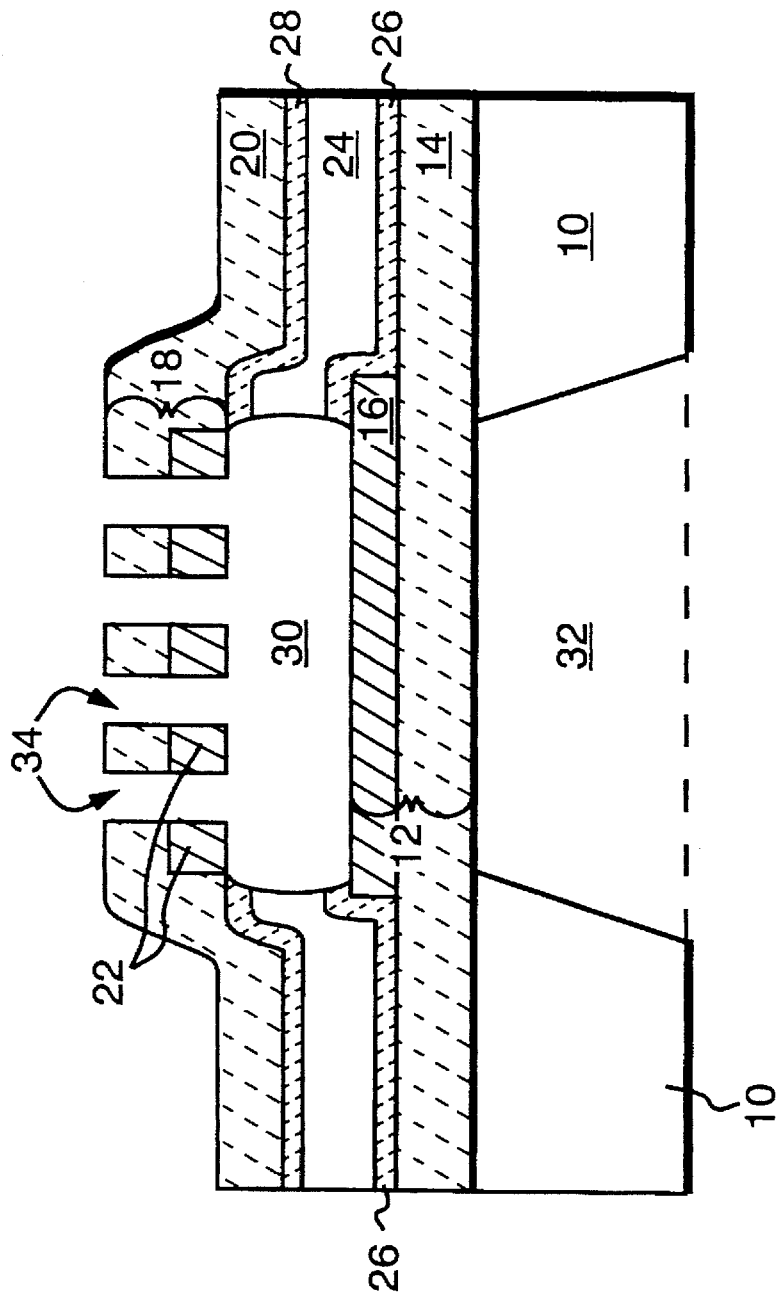
FIG. 1 schematically depicts a device fabricated according to the invention.

A typical microphone fabricated according to the invention is shown in FIG. 1. The device resides on a substrate 10, usually <100>silicon. A diaphragm 12 comprises a dielectric layer 14 and a conductive layer 16. A backplate 18 comprises a dielectric layer 20 and a conductive layer 22. A sacrificial layer 24 separates the diaphragm 12 and the backplate 18. Two diffusion barrier layers 26 and 28 isolate the conductive layers 16 and 22, respectively, from the interposed sacrificial layer 24. A portion of the sacrificial layer 24 and diffusion barrier layers 26 and 28 has been removed to form a cavity 30. A central aperture 32 in the substrate 10 exposes the diaphragm 12 to exterior acoustic pressure. The backplate 18 is perforated with holes 34 to allow air to enter and exit the cavity 30 when the diaphragm flexes. The entire device is essentially monolithic in that it is formed by successive addition of adherent layers onto the substrate 10.

The preferred material for the dielectric layers 14 and 20 is silicon nitride. The patterned conductive layers 16 and 22, which are the capacitor electrodes of the microphone, can be of any one of several materials, including aluminum, gold, copper, nickel, tungsten, titanium, titanium nitride or of compounds or alloys including these materials. The cavity 30 is typically about 3 µm thick. The silicon in the sacrificial layer 24 is usually polycrystalline or amorphous. Typically, dielectric layer 14 is about 0.5 to 1.0 µm thick, and dielectric layer 20 is about 1.5 µm thick. The conductive layers 16 and 22 are each about 0.2 µm thick and square with dimension ranging from about 1 mm to 2 mm. The diffusion barrier layers 26 and 28 are 0.1 to 0.2 µm. Silicon dioxide and titanium nitride make effective diffusion barriers.

Figure 2A:
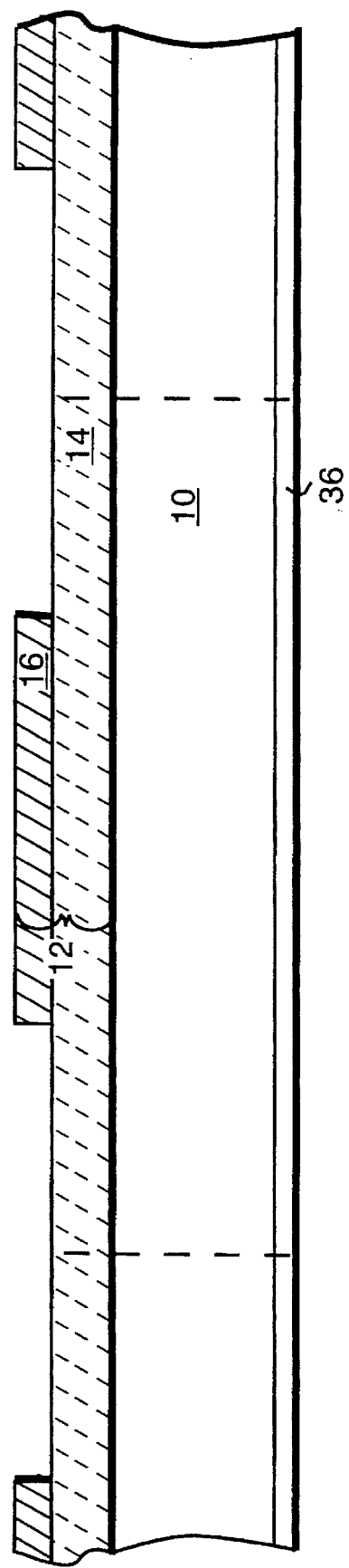
FIGS. 2A–2E are enlarged sections that illustrate steps in part of an inventive process for fabricating a capacitive microphone.

FIGS. 2A–2E illustrate a fabrication sequence of the invention as applied to a section of wafer corresponding to one device using the preferred dielectric layer material with aluminum electrodes and silicon dioxide diffusion barrier layers. With reference to FIG. 2A, the first step is the deposition of dielectric layer 14 of silicon nitride by plasma-enhanced CVD ("PECVD") over the device substrate 10. Stress variations across PECVD silicon nitride layers of an order of magnitude were observed across a single wafer when a single-step PECVD deposition process was used. The adoption of a three-step deposition procedure with 120° rotation between deposition steps reduced this variation to about 10%.

The backside of the substrate 10 is then coated with a passivation layer 36 such as of silicon nitride for protection of the substrate during subsequent processing steps. Next conductive layer 16 is deposited over dielectric layer 14 by a physical deposition method such as sputtering. The conductive layer 16 is patterned to delimit an electrode area on the diaphragm 12 using conventional resist and wet acid etch techniques.

Figure 2B:
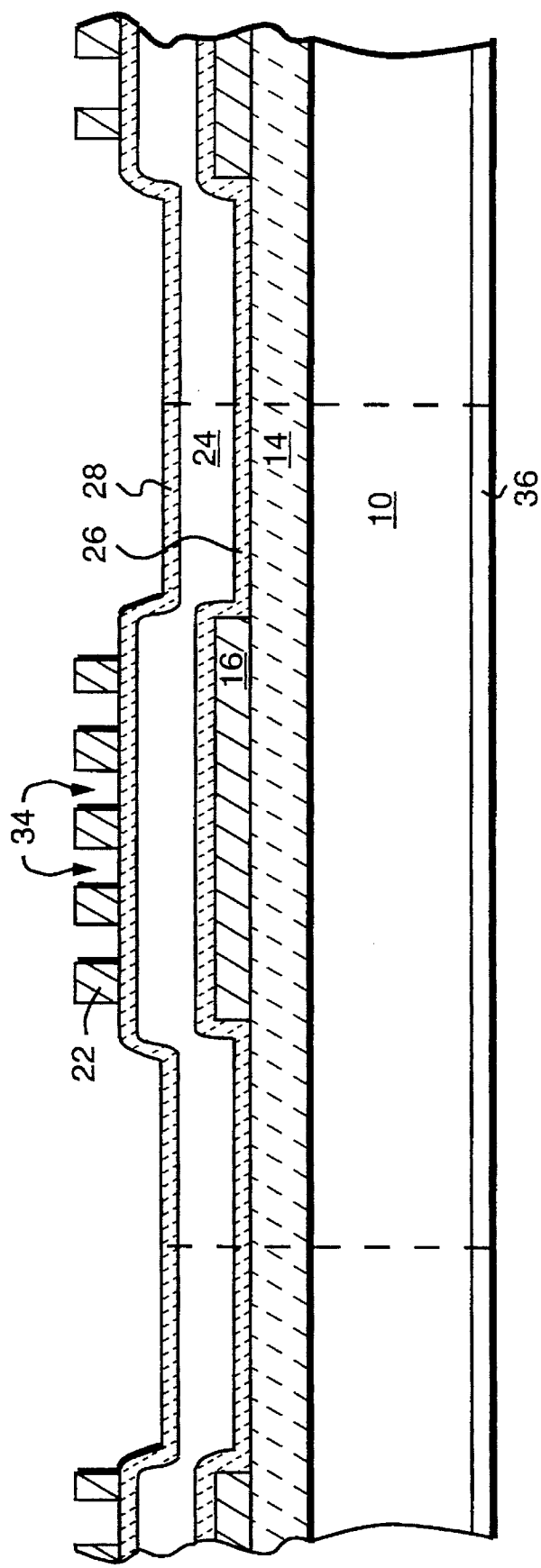

With reference to FIG. 2B, diffusion barrier layer 26 is deposited over patterned conductive layer 16. Then silicon sacrificial layer 24 is deposited over the diffusion barrier 26 by PECVD. The thickness of cavity 30 is determined by the length of this deposition step. The thickness of the silicon sacrificial layer 24 varies across a single wafer by as much as 10%. It was discovered that wafer rotation is not an appropriate solution to this problem owing to the poor adhesion of the silicon observed after exposure of the films to the ambient. Buckling and breakage of thin (less than 0.25 µm) dielectric layers 14 of silicon nitride due to compressive stress in the film were observed. In general, the silicon sacrificial layer 24 film stress imposes a lower limit on the thickness of dielectric layer 14 achievable by this process.

Another diffusion barrier layer 28 is deposited over the silicon sacrificial layer 24. Then the conductive layer 22 is deposited over the diffusion barrier layer 28. Even at PECVD temperatures as low as 350° C., significant alloying between silicon and aluminum would occur during the extended period of time required for the silicon deposition if the silicon sacrificial layer 24 were deposited directly onto the conductive layer 16. Such interdiffusion complicates the formation of cavity 30 and renders the electrodes unserviceable. Diffusion barrier layers 26 and 28 isolate the sacrificial layer 24 and the conductive layers 16 and 22, respectively, from one another during high-temperature processing steps.

Figure 2C:
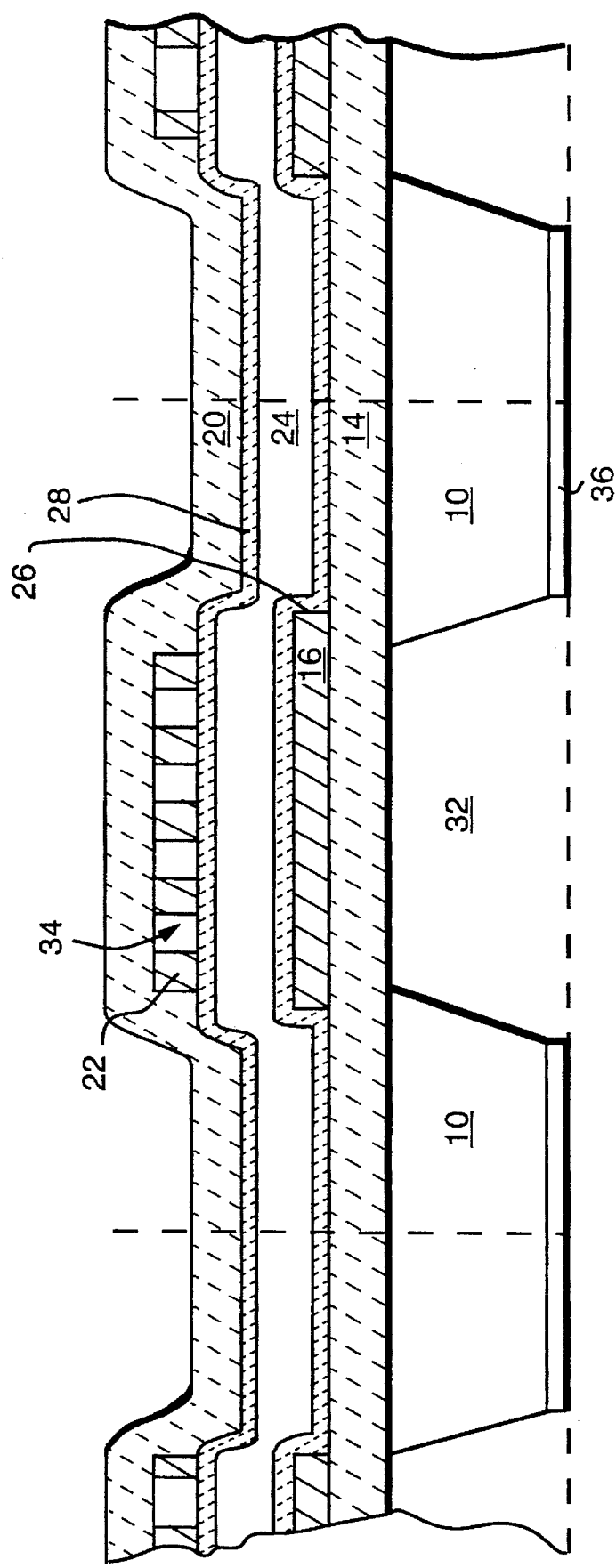

Conventional resist and wet acid etch techniques are applied to form the access holes 34 in conductive layer 22 and to delimit an electrode area on the backplate 18. With reference to FIG. 2C, a dielectric layer 20 of silicon nitride is then deposited over the conductive layer 22 in three steps of equal length as described above for the dielectric layer 14. Typical residual tensile stress in the completed silicon nitride layer 20 is about $2.2 \times 10^8$ N/m$^2$.

This is an appropriate point at which to perform the bulk micromachining of the substrate 10 to expose the diaphragm 12. The unpatterned dielectric layer 20 affords the underlying structure some protection during the formation of aperture 32. Specifically, the backside passivation layer 36 is patterned using conventional resist and reactive ion etching ("RIE") techniques. Then the entire structure is immersed in aqueous ethylene diamine pyrocatechol or potassium hydroxide to produce the tapered aperture 32 in the substrate 10. Alternatively, these patterning and etching steps may be interleaved between the deposition steps that form the dielectric layer 20. The best results were obtained by patterning the backside of the substrate 10 after the first deposition step forming the dielectric layer 20, then completing the dielectric layer 18 followed by wet etching the substrate 10 backside.

Figure 2D:
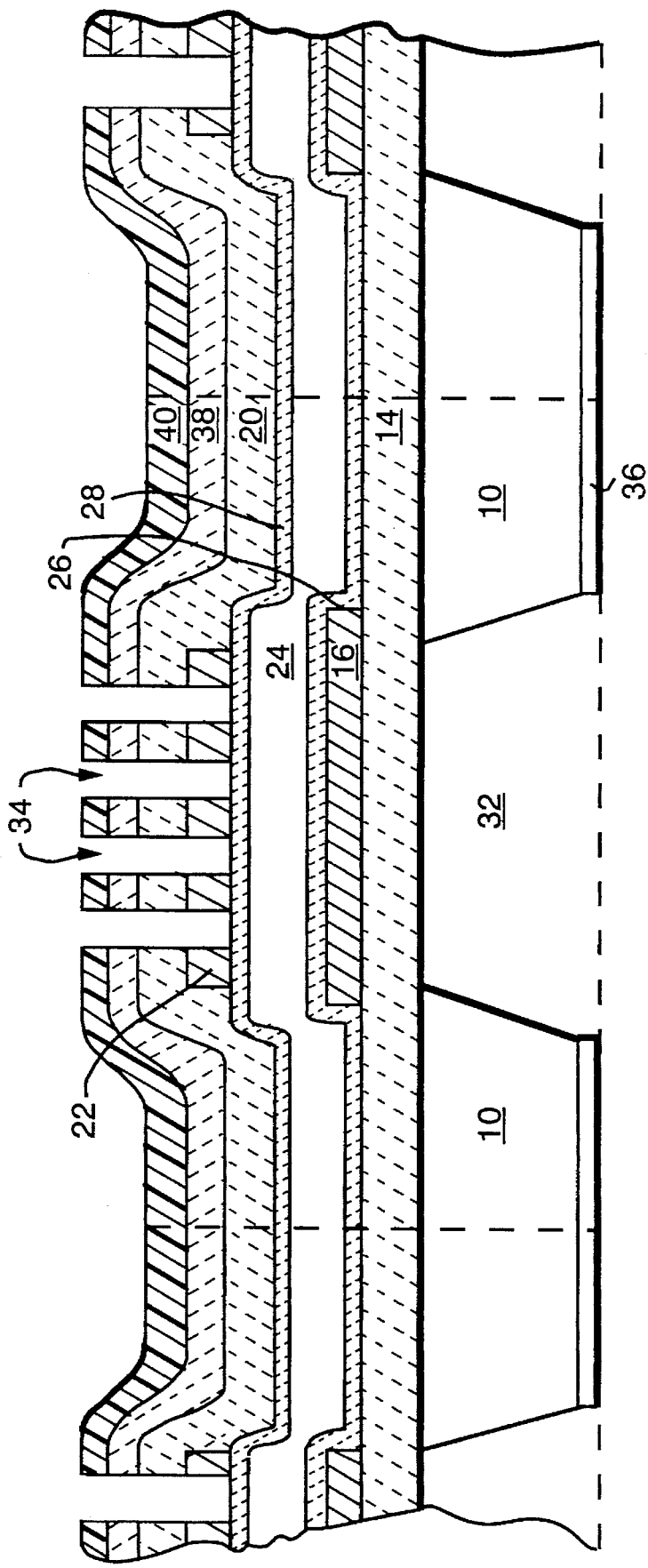

With reference to FIG. 2D, the dielectric layer 20 is patterned to allow access to the sacrificial layer 24 by the etchant. The patterning is done in the following manner. First, a 0.2 µm-thick mask layer 38 such as of PECVD silicon oxide is deposited onto the dielectric layer 20. The layer 38 is then covered by a layer 40 of a photodefinable polymer such as photoresist or a polyimide. The layer 40 which is patterned by conventional resist techniques, after which the layer 38 is selectively removed by an aqueous fluoride etch in a pattern corresponding to the desired array of access holes 34. The layer 40 is not removed immediately after the etch. Then RIE is applied to the dielectric layer 20 to make the access holes 34 continuous from the device exterior to the diffusion barrier layer 28.

Figure 2E:
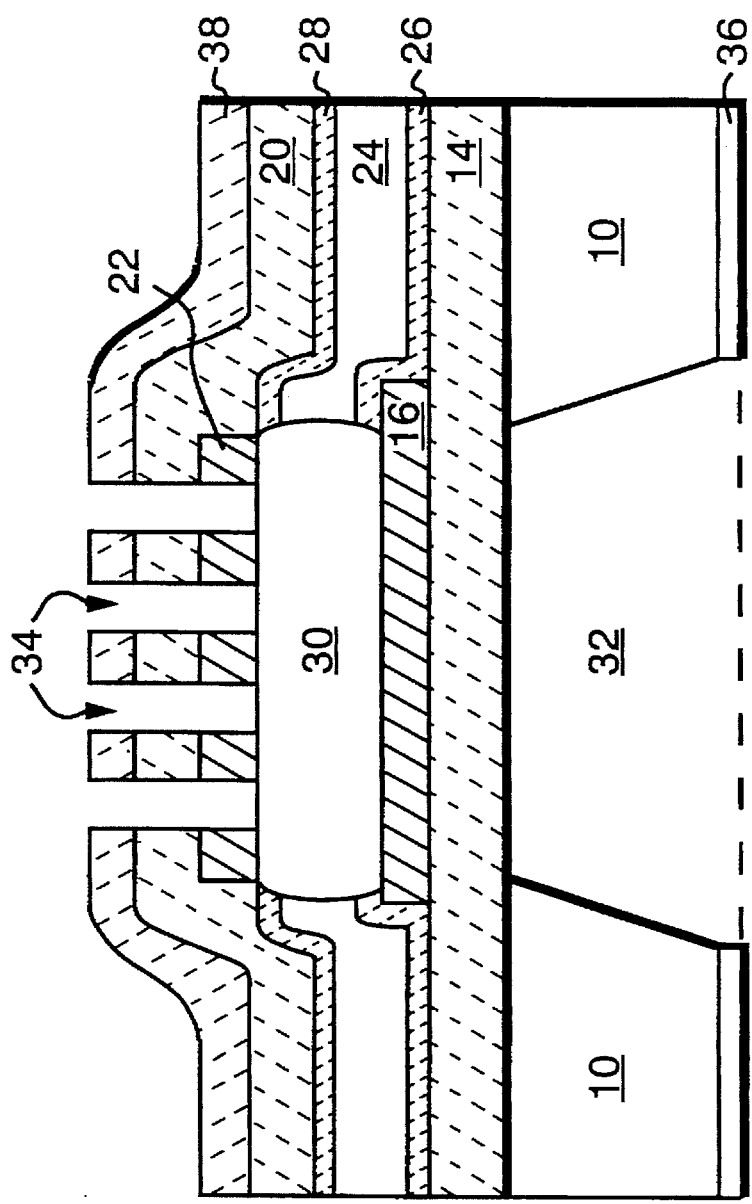

After this patterning, the wafers are diced into individual devices using a wafer saw. The loose dice are then dry-etch released. The release conditions are chosen to promote isotropic movement of the etch front through the silicon sacrificial layer 24 and diffusion barrier layers 26 and 28, which is desirable for removal of the sacrificial layer 24 from under the backplate 18 to form cavity 30, as is shown in FIG. 2E. The etchant also forms pathways (not shown) through the dielectric layer 20, the barrier layers 26 and 28, and the silicon sacrificial layer 24 allowing electrical contact to be made to conductive layers 16 and 22. The layers 38 and 40 help passivate the dielectric layer 20 during etching of the sacrificial layer 24. Pure sulfur hexafluoride at 40 Pa and 300W for 40 minutes is effective. Other effective could include, with or without oxygen, the following: tetraflouoromethane, trifluoromethane, trifluoromethane, or hexafluoroethane. Use of a RIE reactor operating under high-pressure conditions such that the ion flux is unimportant would also fall within the scope of the invention. After etching of the sacrificial layer 24, the layer 40 is stripped in an oxygen plasma.

Vestiges of the diffusion barrier layers 26 and 28 may remain on the inner surfaces of the conductive layers 16 and 22 because of the preferential removal by the etchant of silicon compared with the barrier layer material. If the barrier layers are titanium nitride, which is conductive, the residue does not tend to reduce the device capacitance. Even if the barrier layers are dielectric silicon dioxide, the presence of these very thin layers lining the cavity instead of the thick dielectric layers of prior art processes is advantageous in regard to device sensitivity.

Although devices with various sizes and spacings of the holes 34 in the backplate 18 have been made using this process, the silicon dry-etch release method works best for devices having high density of or small spacing between the holes 34. This is simply because devices with large hole spacings require much longer etch times, resulting in failure of the layer 40 and mask 38 layers and degradation of the mechanical integrity of the dielectric layer 18. Although a thicker layer 40 can mitigate this problem, the process gives better results with device geometries favoring short etch times. A backplate pattern having 625 square 20μ-m holes per mm$^2$ spaced 20 μm apart works well in this method.

The invention is employed to greatest advantage when the microphone is largely constructed out of PECVD materials for reasons of compatibility with conventional semiconductor processing lines and because of the lower processing temperature PECVD affords compared to conventional low-pressure CVD techniques. However, the invention is not limited to the use of PECVD, but also encompasses deposition techniques such as sputtering as well as CVD techniques in general. Moreover, several equivalent processes employing the dry-etch release of a silicon sacrificial layer might be applied to microphone fabrication. For example, dielectric materials other silicon nitride could be used in the diaphragm and backplate. Alternatively, the dielectric layers could be eliminated altogether and a single-stratum conductive layer used for one or both of the backplate and diaphragm. Depending on the overall thermal budget of the process and materials used, it may be possible to apply thinner diffusion barrier layers or to eliminate the barriers altogether. The order of steps such as the release, the bulk micromachining, the deposition of passivation layers, and dicing could be changed. Other mask materials, patterning techniques, and plasma chemistries could be applied.

It will therefore be seen thin the foregoing represents a highly advantageous approach to the fabrication of acoustoelectric transducers using surface micromachining methods. The terms and expressions employed herein are used as terms of description and not of limitation, and there is no intention, in the use of such terms and expressions, of excluding any equivalents of the features shown and described or portions thereof but it is recognized that various modifications are possible within the scope of the invention claimed.

What is claimed is:

1. A method of fabricating a capacitive microphone, said method comprising the steps of:
    A. providing a silicon layer;
    B. positioning a diaphragm and a backplate on opposite sides of the silicon layer;
    C. forming holes in the backplate; and
    D. introducing a dry etchant through the holes to form a cavity between the backplate and diaphragm by removing part of the silicon layer.

2. A method of fabricating a capacitive microphone, said method comprising the steps of:
    A. depositing a diaphragm over a substrate;
    B. depositing a silicon layer over the diaphragm;
    C. depositing a backplate over the silicon layer;
    D. forming holes in the backplate; and
    E. introducing a dry etchant through the holes to form a cavity between the backplate and diaphragm by removing part of the silicon layer.

3. A method of fabricating a capacitive microphone, said method comprising the steps of:
    A. depositing a first silicon nitride layer over a silicon substrate;
    B. depositing a first conductive layer over the first silicon nitride layer;
    C. depositing a first diffusion barrier layer over the first conductive layer;
    D. depositing a silicon layer over the first diffusion barrier layer;
    E. depositing a second diffusion barrier layer over the silicon layer;
    F. depositing a second conductive layer over the second diffusion barrier layer;
    G. depositing a second silicon nitride layer over the second conductive layer;
    H. forming holes in the second conductive and silicon nitride layers;
    I. introducing a dry etchant through the holes to form a cavity between a backplate and a diaphragm by removing part of the silicon layer.

4. The method of claim 3 wherein the etchant is an ionized gas plasma.

5. The method of claim 4 wherein the etchant includes a fluorine-containing species.

6. The method of claim 5 wherein the etchant comprises at least one of sulfur hexafluoride, tetrafluoromethane, trifluoromethane, hexafluoroethane, and nitrogen trifluoride.

7. The method of claim 2 wherein the silicon layer is deposited by chemical vapor deposition.

8. The method of claim 2 further comprising the step of depositing passivation material over the backplate.

9. The method of claim 2 wherein chemical vapor deposition is employed in depositing at least one of the diaphragm and the backplate.

10. The method of claim 3 wherein the silicon layer is deposited by chemical vapor deposition.

11. The method of claim 3 further comprising a step of depositing passivation material onto the second silicon nitride layer.

12. The method of claim 11 wherein the passivation material comprises silicon oxide.

13. The method of claim 11 wherein the passivation material comprises a photodefinable polymer.

14. The method of claim 2 wherein the diaphragm comprises a dielectric layer and a conductive layer.

15. The method of claim 14 wherein the conductive layer is between the dielectric layer and the silicon layer.

16. The method of claim 14 wherein the conductive layer comprises at least one of aluminum, gold, copper, nickel, titanium, titanium nitride, and tungsten.

17. The method of claim 3 wherein at least one of the first and second silicon nitride layers is deposited by chemical vapor deposition.

18. The method of claim 14 wherein the dielectric layer comprises silicon nitride.

19. The method of claim 2 wherein the backplate comprises a dielectric layer and a conductive layer.

20. The method of claim 19 wherein the conductive layer is between the dielectric layer and the silicon layer.

21. The method of claim 19 wherein the conductive layer comprises at least one of aluminum, gold, copper, nickel, titanium, titanium nitride, and tungsten.

22. The method of claim 3 wherein at least one of the first and second silicon nitride layers is deposited incrementally in successive steps and the substrate rotated in-between the steps.

23. The method of claim 19 wherein the dielectric layer comprises silicon nitride.

24. The method of claim 2 further comprising a step of providing a diffusion barrier between the diaphragm and the silicon layer.

25. The method of claim 24 wherein the diffusion barrier comprises at least one of silicon oxide and titanium nitride.

26. The method of claim 2 further comprising a step of providing a diffusion barrier between the backplate and the layer of silicon.

27. The method of claim 26 wherein the diffusion barrier comprises at least one of silicon oxide and titanium nitride.

28. The method of claim 2 wherein incremental deposition in successive steps with substrate rotation in-between the steps is employed in depositing at least one of the backplate and the diaphragm.

29. The method of claim 2 wherein the substrate is of silicon.

30. The method of claim 2 wherein the etchant is an ionized gas plasma.

31. The method of claim 30 wherein the etchant includes a fluorine-containing species.

32. The method of claim 31 wherein the etchant comprises at least one of sulfur hexafluoride, tetrafluoromethane, trifluoromethane, hexafluoroethane, and nitrogen trifluoride.

33. The method of claim 8 wherein the passivation material comprises silicon oxide.

34. The method of claim 8 wherein the passivation material comprises a photodefinable polymer.

* * * * *